United States Patent
Zhang

(10) Patent No.: US 9,905,622 B2
(45) Date of Patent: Feb. 27, 2018

(54) ORGANIC ELECTROLUMINESCENT DEVICE AND MANUFACTURING METHOD THEREOF, EACH HAVING A DISPLAY APPARATUS

(71) Applicant: BOE TECHNOLOGY GROUP CO., LTD., Beijing (CN)

(72) Inventor: Can Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,565

(22) PCT Filed: Oct. 16, 2014

(86) PCT No.: PCT/CN2014/088719
§ 371 (c)(1),
(2) Date: Aug. 18, 2015

(87) PCT Pub. No.: WO2016/029535
PCT Pub. Date: Mar. 3, 2016

(65) Prior Publication Data
US 2016/0247864 A1     Aug. 25, 2016

(30) Foreign Application Priority Data

Aug. 27, 2014     (CN) .......................... 2014 1 0429378

(51) Int. Cl.
*H01L 27/32* (2006.01)
*H01L 51/56* (2006.01)
*H01L 51/05* (2006.01)

(52) U.S. Cl.
CPC ........ *H01L 27/3258* (2013.01); *H01L 27/326* (2013.01); *H01L 27/3246* (2013.01);
(Continued)

(58) Field of Classification Search
CPC .......................... H01L 51/0545; H01L 51/56
See application file for complete search history.

(56) References Cited

U.S. PATENT DOCUMENTS

| 8,466,466 B2 | 6/2013 | Ha et al. |
| 8,841,836 B2 | 9/2014 | Kim et al. |

(Continued)

FOREIGN PATENT DOCUMENTS

| CN | 102456713 A | 5/2012 |
| CN | 103219355 A | 7/2013 |

(Continued)

OTHER PUBLICATIONS

International Search Report of PCT/CN2014/088719 in Chinese, dated May 4, 2015 with English translation.

(Continued)

*Primary Examiner* — Michael Jung
(74) *Attorney, Agent, or Firm* — Collard & Roe, P.C.

(57) ABSTRACT

An organic electroluminescent device and a manufacturing method thereof, a display apparatus are provided. The organic electroluminescent device includes a plurality of pixel units in an array form. Each of the pixel units includes a light emitting region and a transparent region, and each of the pixel units includes: a base substrate (1); a thin film transistor switch (2); a planarizing layer (3), a first electrode (4), a pixel defining layer (5), an organic layer (6) and a second electrode (7), disposed at a side of the thin film transistor switch (2) facing away from the base substrate (1) in this order. The first electrode (4) is positioned in the light emitting region (A) of the pixel unit; and at least one of the planarizing layer (3) and the pixel defining layer (5) is only disposed within the light emitting region (A) of the pixel (Continued)

Fig.2 unit. With the above organic electroluminescent device, transmittance of the transmissive region of each pixel unit is enhanced.

15 Claims, 3 Drawing Sheets

(52) U.S. Cl.
CPC ...... *H01L 27/3262* (2013.01); *H01L 51/0545* (2013.01); *H01L 51/56* (2013.01); *H01L 27/3248* (2013.01); *H01L 2227/323* (2013.01)

(56) References Cited

U.S. PATENT DOCUMENTS

| | | | |
|---|---|---|---|
| 9,111,890 B2 | 8/2015 | Chung et al. | |
| 9,164,211 B2 | 10/2015 | Yim et al. | |
| 9,287,339 B2 | 3/2016 | Lee et al. | |
| 2006/0043403 A1 | 3/2006 | Hwang | |
| 2011/0163318 A1 | 7/2011 | Park et al. | |
| 2012/0007083 A1 | 1/2012 | You et al. | |
| 2012/0049215 A1* | 3/2012 | Yoon | H01L 27/326 257/91 |
| 2012/0268696 A1* | 10/2012 | Yim | G09G 3/32 349/104 |
| 2013/0314647 A1 | 11/2013 | Yim et al. | |
| 2014/0217397 A1* | 8/2014 | Kwak | H01L 27/1218 257/43 |
| 2016/0035809 A1* | 2/2016 | Park | H01L 27/3265 257/40 |
| 2016/0043154 A1* | 2/2016 | Choi | H01L 27/3258 257/40 |
| 2016/0093679 A1* | 3/2016 | Moon | H01L 27/326 257/40 |
| 2016/0126494 A1* | 5/2016 | Jung | H01L 27/3258 257/72 |
| 2016/0149155 A1* | 5/2016 | Kim | H01L 51/5228 257/40 |

FOREIGN PATENT DOCUMENTS

| | | |
|---|---|---|
| CN | 203118951 U | 8/2013 |
| CN | 103378124 A | 10/2013 |
| CN | 103426901 A | 12/2013 |
| CN | 103489891 A | 1/2014 |
| CN | 103700685 A | 4/2014 |
| CN | 103985734 A | 8/2014 |
| JP | 2008-112112 A | 5/2008 |
| KR | 10-2013-0071543 A | 7/2013 |

OTHER PUBLICATIONS

Notice of Transmittal of the International Search Report of PCT/CN2014/088719 in Chinese, dated May 4, 2015.
Written Opinion of the International Searching Authority of PCT/CN2014/088719 in Chinese, dated May 4, 2015 with English translation.
Chinese Office Action in Chinese Application No. 201410429378.3 dated Mar. 3, 2016 with English translation.
Second Chinese Office Action in Chinese Application No. 201410429378.3 dated Sep. 23, 2016 with English translation.

* cited by examiner

ORGANIC ELECTROLUMINESCENT DEVICE AND MANUFACTURING METHOD THEREOF, EACH HAVING A DISPLAY APPARATUS

CROSS REFERENCE TO RELATED APPLICATIONS

This application is the National Stage of PCT/CN2014/088719 filed on Oct. 16, 2014, which claims priority under 35 U.S.C. § 119 of Chinese Application No. 201410429378.3 filed on Aug. 27, 2014, the disclosure of which is incorporated by reference.

TECHNICAL FIELD

At least one embodiment of the present invention relates to an organic electroluminescent device and a manufacturing method thereof, a display apparatus.

BACKGROUND

The transparent display, as a new display technology, allows a viewer to see the background behind a screen through the screen of a display device. An organic electroluminescent device is such a display device that it is convenient for it to realize the transparent display.

In the organic electroluminescent device, for facilitating realization of the transparent display, each of pixel units in the organic electroluminescent device has a light emitting region and a transparent region. An electroluminescent structure is formed within the light emitting region of each pixel unit, and the transparent region of each pixel unit is configured to realize the transparent display.

SUMMARY OF THE INVENTION

According to at least one embodiment of the present invention, there are provided an organic electroluminescent device and a manufacturing method thereof, a display apparatus. A transparent region of each pixel unit in the organic electroluminescent device has a relatively higher transmittance, and thus, the display effect of the organic electroluminescent device upon transparent display is improved.

According to at least one embodiment of the invention, there is provided an organic electroluminescent device, comprising a plurality of pixel units in an array form, wherein each of the pixel units comprises a light emitting region and a transparent region, and each of the pixel units comprises: a base substrate; a thin film transistor switch, formed on the base substrate; a planarizing layer, a first electrode, a pixel defining layer, an organic layer and a second electrode, disposed at a side of the thin film transistor switch facing away from the base substrate in this order, wherein the first electrode is positioned in the light emitting region of the pixel unit, and at least one of the planarizing layer and the pixel defining layer is only disposed within the light emitting region of the pixel unit.

According to at least one embodiment of the present invention, there is further provided a manufacturing method of the organic electroluminescent device as mentioned above, which includes fabricating a thin film transistor device on a base substrate; forming a planarizing layer at a side of the thin film transistor device facing away from the base substrate; forming a first electrode layer on the planarizing layer, and forming a pattern of a first electrode through a patterning process; forming a pixel defining layer on the first electrode; forming an organic layer on the pixel defining layer; forming a second electrode on the organic layer, wherein a portion of at least one of the planarizing layer and the pixel defining layer which is positioned within a transparent region of a pixel unit is removed by a patterning process.

According to at least one embodiment of the present invention, there is further provided a display apparatus, which includes the above organic electroluminescent device.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, and are not construed as limiting of the present invention.

DESCRIPTION OF THE EMBODIMENTS

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As noticed by inventor(s) of the present application, the transmittance of a transparent region within each pixel unit in an electroluminescent device is relatively poor, and in turn, this leads to a relatively poor effect of transparent display of the organic electroluminescent device.

Figure 1:
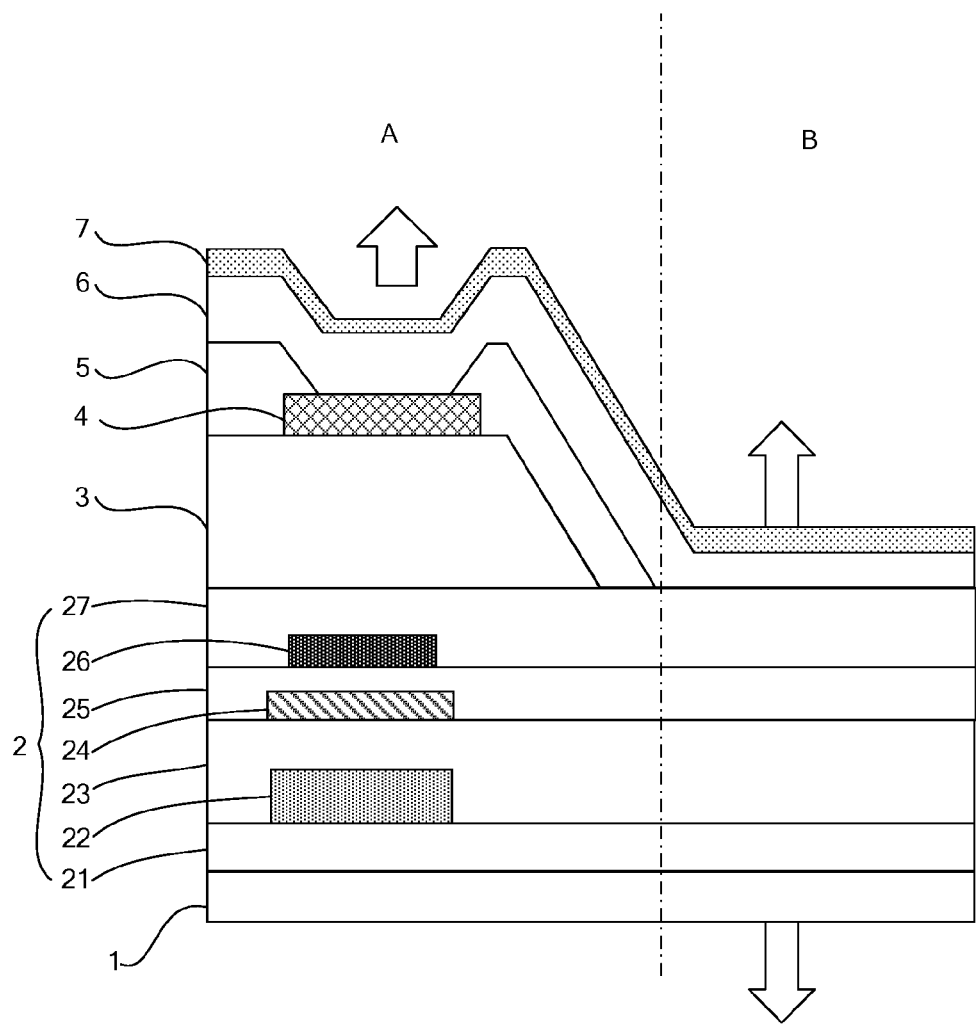
FIG. 1 is a structurally schematic view illustrating an organic electroluminescent device provided by an embodiment of the invention.

Please refer to FIG. 1. an organic electroluminescent device provided by at least one embodiment of the present invention includes a plurality of pixel units in an array form. Each of the pixel units includes a light emitting region A and a transparent region B, and each of the pixel units includes: a base substrate 1; a thin film transistor (TFT) switch 2, formed on the base substrate 1; and a planarizing layer 3, a first electrode 4, a pixel defining layer 5, an organic layer 6 and a second electrode 7, disposed at a side of the thin film transistor switch 2 facing away from the base substrate 1 in this order. The first electrode 4 is positioned in the light emitting region A of the pixel unit; and at least one of the planarizing layer 3 and the pixel defining layer 5 is only disposed within the light emitting region A of the pixel unit.

In an organic electroluminescent device, although a planarizing layer and a pixel defining layer for forming a light emitting structure are made of transparent substances, respectively, the planarizing layer and the pixel defining layer will still make an impact on the transmittance of a transparent region in a pixel unit.

While in the above organic electroluminescent device, at least one of the planarizing layer 3 and the pixel defining layer 5 that are configured to form a light emitting structure located within the light emitting region A in each of the pixel units is only disposed within the light emitting region A of the pixel unit. So, for the planarizing layer 3 and the pixel defining layer 5 for forming the light emitting structure, when the planarizing layer 3 is merely disposed within the light emitting region A of the pixel unit, the planarizing layer 3 will not make an impact on the transmittance of the transparent region B of the pixel unit; and when the pixel defining layer 5 is merely disposed within the light emitting region A of the pixel unit, the pixel defining layer 5 will not make an impact on the transmittance of the transparent region B of the pixel unit. In turn, the transmittance of the transmissive region B of each pixel unit is enhanced.

Consequently, in the organic electroluminescent device provided by embodiments of the present invention, the transmittance of the transparent region B of each pixel unit is relatively high, and in turn, the display effect of the organic electroluminescent device upon transparent display is improved.

As shown in FIG. 1, in an embodiment, both of the planarizing layer 3 and the pixel defining layer 5 are only disposed within the light emitting region A of the pixel unit.

In the organic electroluminescent device provided by the above embodiment, the thin film transistor switch 2 may be in many forms, and it may be of a top-gate type, and it may also be of a bottom-gate type.

Please continue to refer to FIG. 1. In an embodiment, the thin film transistor switch 2 may include: a semiconductor active layer 22, disposed above the base substrate 1 and within the light emitting region A of the pixel unit; a gate insulating layer 23, disposed above the base substrate 1; a gate electrode 24, disposed above the base substrate 1 and within the light emitting region A of the pixel unit; an interlayer insulating layer 25, disposed above the base substrate 1; a source/drain electrode 26, disposed on the interlayer insulating layer 25, which lies within the light emitting region A of the pixel unit; and a passivation layer 27, disposed on the source/drain electrode 26.

In order to further enhance the transmittance of the transparent region B of each pixel unit of the above organic electroluminescent device, the thin film transistor switch 2 with the above structure may at least meet one of the following conditions:

The gate insulating layer 23 is merely disposed in the light emitting region A of the pixel unit.

The interlayer insulating layer 25 is merely disposed in the light emitting region A of the pixel unit.

The passivation layer 27 is merely disposed in the light emitting region A of the pixel unit.

A buffer layer 21 may also be disposed on the base substrate, and the buffer layer 21 may only be disposed in the light emitting region A of the pixel unit.

The thin film transistor switch shown in FIG. 1 is of a top-gate type, and in this case, the gate insulating layer 23 may be disposed on the semiconductor active layer 22, the gate electrode 24 is disposed on the gate insulating layer 23, the interlayer insulating layer 25 is disposed on the gate electrode 24, and the buffer layer is disposed between the semiconductor active layer 22 and the base substrate 1. When the thin film transistor switch is of a bottom-gate type, a gate insulating layer may be disposed on a gate electrode, a semiconductor active layer is disposed on the gate insulating layer, an interlayer insulating layer is disposed on the semiconductor active layer, and a buffer layer is disposed between the gate electrode and a base substrate.

Figure 2:
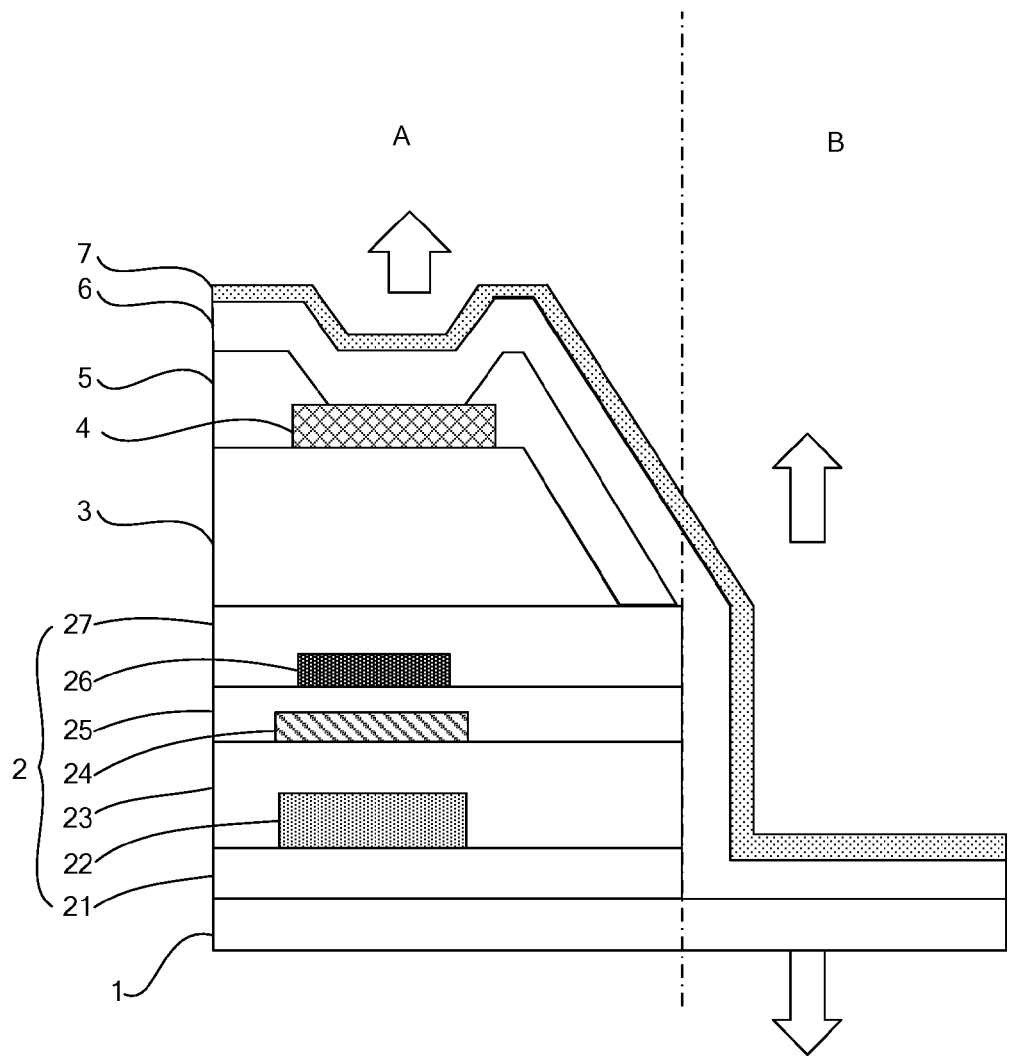
FIG. 2 is another structurally schematic view illustrating an organic electroluminescent device provided by an embodiment of the invention.
Figure 3:
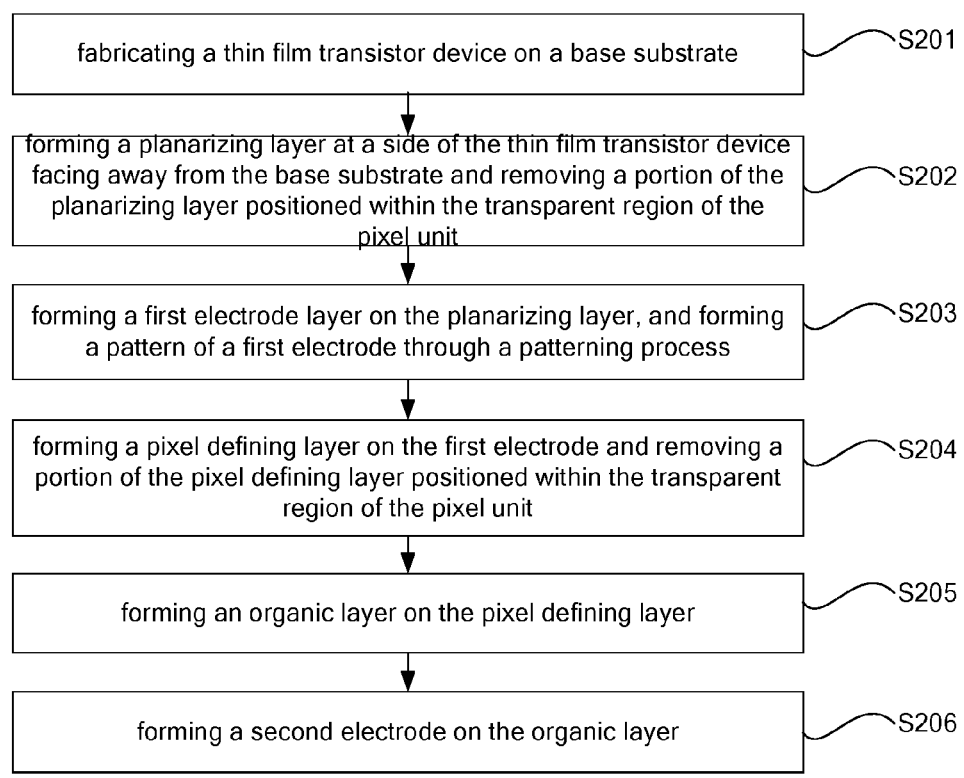
FIG. 3 is a schematic flowchart illustrating a manufacturing method of an organic electroluminescent device provided by an embodiment of the invention.

In addition, according to at least one embodiment of the present invention, there is further provided a manufacturing method of the above-mentioned organic electroluminescent device. As shown in FIG. 2, the manufacturing method includes the following steps S201 to S206, and these steps will be specifically introduced below.

Step S201: a thin film transistor device is fabricated on a base substrate.

Step S202: a planarizing layer is formed at a side of the thin film transistor device facing away from the base substrate. For example, a patterning process in the step S202 may be an etching process.

Step S203: a first electrode layer is formed on the planarizing layer, and a pattern of a first electrode is formed through a patterning process.

Step S204: a pixel defining layer is formed on the first electrode. For example, a patterning process in the step S204 may be an etching process.

Step S205: an organic layer is formed on the pixel defining layer.

Step S206: a second electrode is formed on the organic layer.

In the manufacturing method provided by an embodiment of the invention, a portion of at least one of the planarizing layer and the pixel defining layer which is positioned within the transparent region of the pixel unit may be removed by a patterning process. That is, in the step S202, a portion of the planarizing layer which is positioned within the transparent region of the pixel unit may be removed by a patterning process; and/or, in the step S204, a portion of the pixel defining layer which is positioned within the transparent region of the pixel unit may be removed by a patterning process.

In the above manufacturing method, a portion of the planarizing layer which is positioned within the transparent region is removed upon fabrication of the planarizing layer in the step S202, and moreover, a portion of the pixel defining layer which is positioned within the transparent region is removed upon fabrication of the pixel defining layer in the step S204. Then, it can be prevented that the planarizing layer and the pixel defining layer make an impact on transmittance of the transparent region of the pixel unit.

For the above step S201, fabricating the thin film transistor device on the base substrate, for example, may include forming a semiconductor active layer on the base substrate, and forming a pattern of the semiconductor active layer through a patterning process, the semiconductor active layer being positioned within the light emitting region of the pixel unit; forming a gate insulating layer above the base substrate; forming a gate metal layer above the base substrate, and forming a pattern of a gate electrode through a patterning process, the gate electrode being positioned within the light emitting region of the pixel unit; forming an interlayer insulating layer above the base substrate; forming a source/drain metal layer on the interlayer insulating layer, and forming a pattern of a source/drain electrode through a patterning process, the source/drain electrode being positioned within the light emitting region; and forming a passivation layer on the source/drain electrode.

In the above step S201, fabricating the thin film transistor device on the base substrate may further include forming a buffer layer on the base substrate, and removing a portion of the buffer layer positioned within the transparent region of the pixel unit through a patterning process. The buffer layer formed by this step is merely disposed in the light emitting region of the pixel unit, and will not make an impact on transmittance of the transparent region in the pixel unit, and thus, transmittance of the transparent region in the pixel unit is enhanced.

In the above step S201, forming the gate insulating layer above the base substrate, for example, may include: forming a gate insulating layer on the semiconductor active layer, and removing a portion of the gate insulating layer which is positioned within the transparent region of the pixel unit through a patterning process. The gate insulting layer formed by this step is merely disposed in the light emitting region of the pixel unit, and will not make an impact on transmittance of the transparent region in the pixel unit, and thus, transmittance of the transparent region in the pixel unit is enhanced.

In the above step S201, forming the interlayer insulating layer above the base substrate, for example, may include: forming an interlayer insulating layer on the gate electrode, and removing a portion of the interlayer insulating layer which is positioned within the transparent region of the pixel unit through a patterning process. The interlayer insulting layer formed by this step is merely disposed in the light emitting region of the pixel unit, and will not make an impact on transmittance of the transparent region in the pixel unit, and thus, transmittance of the transparent region in the pixel unit is enhanced.

In the above step S201, forming the passivation layer on the source/drain electrode, for example, may include: forming a passivation layer on the source/drain electrode, and removing a portion of the passivation layer which is positioned within the transparent region of the pixel unit through a patterning process. The passivation layer formed by this step is merely disposed in the light emitting region of the pixel unit, and will not make an impact on transmittance of the transparent region in the pixel unit, and thus, transmittance of the transparent region in the pixel unit is enhanced.

In the above embodiment, the thin film transistor switch may be of a top-gate type, and in this case, the gate insulating layer may be disposed on the semiconductor active layer, the gate electrode is disposed on the gate insulating layer, the interlayer insulating layer is disposed on the gate electrode, and the buffer layer is disposed between the semiconductor active layer and the base substrate. Of course, the thin film transistor switch may also be of a bottom-gate type, and in this case, a gate insulating layer may be disposed on a gate electrode, a semiconductor active layer is disposed on the gate insulating layer, an interlayer insulating layer is disposed on the semiconductor active layer, and a buffer layer is disposed between the gate electrode and a base substrate.

According to at least one embodiment of the present invention, there is further provided a display apparatus, which includes an organic electroluminescent device provided by any of the above embodiments. The display apparatus may be an electronic paper, an OLED panel, a cell phone, a tablet computer, a television, a display, a notebook computer, a digital photo frame, a navigator or any other product or component having a display function.

Apparently, various modifications and variants can be made to embodiments of the invention by those skilled in the art without departing from the spirit and scope of the invention. As such, provided that these modifications and variants of the invention fall within the scope of claims of the invention and equivalent technologies thereof, it is also intended for the invention to embrace them therein.

The application claims priority of Chinese Patent Application No. 201410429378.3 filed on Aug. 27, 2014, the disclosure of which is incorporated herein by reference in its entirety as part of the present application.

What is claimed is:

1. An organic electroluminescent device, comprising pixel units in an array form, wherein each of the pixel units comprises a light emitting region and a transparent region, and each of the pixel units comprises:
   a base substrate;
   a thin film transistor, formed on the base substrate;
   a planarizing layer, a first electrode, a pixel defining layer, an organic layer and a second electrode, disposed at a side of the thin film transistor facing away from the base substrate in this order,
   wherein the planarizing layer and the pixel defining layer are disposed merely within the light emitting region of the pixel unit,
   the organic layer and the second electrode are both disposed to cover the whole transparent region, and
   the thin film transistor comprises a buffer layer provided on the base substrate, and the buffer layer is disposed merely in the light emitting region of the pixel unit.

2. The organic electroluminescent device claimed as claim 1, wherein the thin film transistor comprises:
   a semiconductor active layer, disposed on the base substrate and within the light emitting region of the pixel unit;
   a gate insulating layer, disposed above the base substrate;
   a gate electrode, disposed above the base substrate and within the light emitting region of the pixel unit;
   an interlayer insulating layer, disposed above the base substrate;
   a source/drain electrode, disposed on the interlayer insulating layer and within the light emitting region of the pixel unit; and
   a passivation layer, disposed on the source/drain electrode.

3. The organic electroluminescent device claimed as claim 2, wherein the gate insulating layer is disposed merely in the light emitting region of the pixel unit.

4. The organic electroluminescent device claimed as claim 3, wherein the interlayer insulating layer is disposed merely in the light emitting region of the pixel unit.

5. The organic electroluminescent device claimed as claim 3, wherein the passivation layer is disposed merely in the light emitting region of the pixel unit.

6. The organic electroluminescent device claimed as claim 2, wherein the interlayer insulating layer is disposed merely in the light emitting region of the pixel unit.

7. The organic electroluminescent device claimed as claim 2, wherein the passivation layer is disposed merely in the light emitting region of the pixel unit.

8. The organic electroluminescent device claimed as claim 2, wherein the gate insulating layer is disposed on the semiconductor active layer, the gate electrode is disposed on the gate insulating layer, and the interlayer insulating layer is disposed on the gate electrode; or
   the gate insulating layer is disposed on the gate electrode, the semiconductor active layer is disposed on the gate insulating layer, and the interlayer insulating layer is disposed on the semiconductor active layer.

9. A display apparatus, comprising an organic electroluminescent device comprising pixel units in an array form, wherein each of the pixel units comprises a light emitting region and a transparent region, and each of the pixel units comprises:

a base substrate;

a thin film transistor, formed on the base substrate;

a planarizing layer, a first electrode, a pixel defining layer, an organic layer and a second electrode, disposed at a side of the thin film transistor facing away from the base substrate in this order, wherein the planarizing layer and the pixel defining layer are disposed merely within the light emitting region of the pixel unit, the organic layer and the second electrode are both disposed to cover the whole transparent region, the thin film transistor comprises a buffer layer provided on the base substrate, and the buffer layer is disposed merely in the light emitting region of the pixel unit.

10. A manufacturing method of the organic electroluminescent device claimed as claim 1, comprising fabricating a thin film transistor device on a base substrate;

forming a planarizing layer at a side of the thin film transistor device facing away from the base substrate;

forming a first electrode layer on the planarizing layer, and forming a pattern of a first electrode through a patterning process;

forming a pixel defining layer on the first electrode;

forming an organic layer on the pixel defining layer;

forming a second electrode on the organic layer, wherein a portion of the planarizing layer positioned within the transparent region of the pixel unit is removed; a portion of the pixel defining layer positioned within the transparent region of the pixel unit is removed, the thin film transistor comprises a buffer layer, and a portion of the buffer layer positioned within the transparent region of the pixel unit is removed through a patterning process, wherein the planarizing layer and the pixel defining layer are disposed merely within the light emitting region of the pixel unit, the organic layer and the second electrode are both disposed to cover the whole transparent region, and the thin transistor comprises a buffer layer provided on the base substrate, and the buffer layer is disposed merely in the light emitting region of the pixel unit.

11. The manufacturing method claimed as claim 10, wherein fabricating the thin film transistor device on the base substrate comprises:

forming a semiconductor active layer on the base substrate, and forming a pattern of the semiconductor active layer through a patterning process, the semiconductor active layer being positioned within the light emitting region of the pixel unit;

forming a gate insulating layer above the base substrate;

forming a gate metal layer above the base substrate, and forming a pattern of a gate electrode through a patterning process, the gate electrode being positioned within the light emitting region of the pixel unit;

forming an interlayer insulating layer above the base substrate;

forming a source/drain metal layer on the interlayer insulating layer, and forming a pattern of a source/drain electrode through a patterning process, the source/drain electrode being positioned within the light emitting region of the pixel unit; and forming a passivation layer on the source/drain electrode.

12. The manufacturing method claimed as claim 11, wherein forming the gate insulating layer above the base substrate comprises:

removing a portion of the gate insulating layer positioned within the transparent region of the pixel unit through a patterning process.

13. The manufacturing method claimed as claim 11, wherein forming the interlayer insulating layer above the base substrate comprises:

removing a portion of the interlayer insulating layer positioned within the transparent region of the pixel unit through a patterning process.

14. The manufacturing method claimed as claim 11, wherein forming the passivation layer on the source/drain electrode comprises:

removing a portion of the passivation layer positioned within the transparent region of the pixel unit through a patterning process.

15. The manufacturing method claimed as claim 11, wherein the gate insulating layer is disposed on the semiconductor active layer, the gate electrode is disposed on the gate insulating layer, and the interlayer insulating layer is disposed on the gate electrode; or the gate insulating layer is disposed on the gate electrode, the semiconductor active layer is disposed on the gate insulating layer, and the interlayer insulating layer is disposed on the semiconductor active layer.

* * * * *